US007881310B2

(12) United States Patent
Kandlur et al.

(10) Patent No.: US 7,881,310 B2
(45) Date of Patent: Feb. 1, 2011

(54) METHOD AND APPARATUS FOR PROVIDING QUALITY OF SERVICE TO VOIP OVER 802.11 WIRELESS LANS

(75) Inventors: Dilip Dinkar Kandlur, San Jose, CA (US); Zon-Yin Shae, South Salem, NY (US); Arup Acharya, Nanuet, NY (US)

(73) Assignee: LENOVO (Singapore) PTE Ltd., Singapore (SG)

( * ) Notice: Subject to any disclaimer, the term of this patent is extended or adjusted under 35 U.S.C. 154(b) by 917 days.

(21) Appl. No.: 10/580,764

(22) PCT Filed: Nov. 26, 2003

(86) PCT No.: PCT/US03/38812
§ 371 (c)(1),
(2), (4) Date: May 14, 2007

(87) PCT Pub. No.: WO2005/064955
PCT Pub. Date: Jul. 14, 2005

(65) Prior Publication Data
US 2007/0201409 A1 Aug. 30, 2007

(51) Int. Cl.
*H04L 12/28* (2006.01)
(52) U.S. Cl. .................. 370/401; 370/338; 370/352; 370/447
(58) Field of Classification Search .................. None
See application file for complete search history.

(56) References Cited

U.S. PATENT DOCUMENTS 6,914,890 B1* 7/2005 Tobita et al. ............. 370/338

| 7,010,305 B2* | 3/2006 | Immonen et al. ......... 455/452.2 |
| 2003/0149774 A1 | 8/2003 | McConnell et al. |
| 2003/0174693 A1 | 9/2003 | Gallant et al. |
| 2003/0186702 A1 | 10/2003 | McConnell et al. |
| 2005/0195786 A1* | 9/2005 | Shpak ....................... 370/338 |

FOREIGN PATENT DOCUMENTS

| JP | 2003-506967 | 2/2003 |
| JP | 2003-258879 | 9/2003 |
| WO | WO01/11837 | 2/2001 |

(Continued)

OTHER PUBLICATIONS

EPO Supplementary European Search Report, dated Jul. 19, 2007, for foreign counterpart European Application No. EP 03796738.

(Continued)

*Primary Examiner*—Duc C Ho

(57) ABSTRACT

The present invention provides a method and system for providing quality-of-service to VoIP over a wireless local access network by providing periodic, contention-free access to a wireless link for voice packets. This is achieved by coupling Session Initiation Protocol ("SIP") signaling for call setup with the Point Coordination Function mode of operation of the 802.11 medium access control. The result is that VoIP call signaling via SIP is tied with availability of periodic time-slots on the wireless medium. The periodic time-slots are used to guarantee contention-free access to the wireless link for voice packets. Accordingly, the present invention, in effect, merges two networking technologies: SIP-based VoIP and 802.11-based wireless LANs.

35 Claims, 3 Drawing Sheets

FOREIGN PATENT DOCUMENTS

| | | |
|---|---|---|
| WO | WO 02/073998 A2 | 9/2002 |
| WO | WO 03/043266 A1 | 5/2003 |

OTHER PUBLICATIONS

EPO Communication pursuant to Article 96(2) EPC, dated Oct. 25, 2007, for foreign counterpart European Application No. EP 03796738.

EPO Communication pursuant to Article 94(3) EPC, dated Jul. 29, 2008, for foreign counterpart European Application No. EP 03796738.

EPO Communication pursuant to Article 94(3) EPC, dated May 7, 2009, for foreign countrepart European Application No. EP 03796738.

D. Chen, et al. "Supporting VBR VoIP Traffic in IEEE 802.11 WLAN in PCF Mode," Jul. 1, 2002; pp. 1-6.

International Preliminary Examination Report.

Ref: A study for VoIP Requirements on IEEE 802.11 WLAN/ Takefemi Hiraguri et al/Aug. 28, 2003.

IEICE Tech Report vol. 103, #289/Priority Control Method for High Quality VoIP Systems over Wireless LAN/Sep. 4, 2003.

IEEE Std 802.11-1997/PartII: Wireless Law Medium Access Control (MAC) and Physical Layer(PHY)spec,p. 1,47,51,52.

Session Initiation Protocol Basic call flow examples/Aug. 2002.

* cited by examiner

METHOD AND APPARATUS FOR PROVIDING QUALITY OF SERVICE TO VOIP OVER 802.11 WIRELESS LANS

BACKGROUND OF THE INVENTION

1. Field of the Invention

The present invention relates to computer networks, and, more particularly, to voice-over-IP networks over wireless local area networks.

2. Description of the Related Art

Traditional telephony carriers, which primarily utilize a public-switched telephony network ("PSTN"), are moving towards a packet-based Voice-over-IP ("VoIP") infrastructure. A key component of a typical telephony infrastructure is "call control." Call control comprises a call setup and a call teardown. Both the call setup and the call teardown involve an exchange of call control messages between two end users. Either end user may initiate the setup or teardown. The call setup allocates resources for the exchange of voice and/or data between the two end users. In contrast, the call teardown frees up those resources such that other end users may exchange voice and/or data. In VoIP, call control is achieved through Session Initiation Protocol ("SIP"). It should be noted that one of ordinary skill in the are would contemplate achieving call control through any of a variety of other known protocols.

In addition to carrier networks, VoIP has been steadily ground in enterprise networks as well. In parallel with the adoption of VoIP, many enterprise networks are in the process of deploying support network access via IEEE 802.11 based wireless local area networks ("LANs"). The 802.11 wireless LAN standard offers a medium access method, called Point Coordination Function ("PCF"), that offers support for near-isochronous (i.e., real-time) services where an "Access Point" periodically polls individual stations for packets to transmit. However, there has been little deployment of VoIP over wireless LANs using PCF. A key reason is that most 802.11 Access Points support a medium access method known as Distributed Coordination Function ("DCF"), that is contention-based, i.e., each wireless station competes for control of the wireless medium. While the DCF method works for data packets, VoIP packets, on the other hand, require timely, periodic access to the wireless medium to maintain acceptable voice quality. With increasing use of wireless LANs in the enterprise, use of IP softphones, for example, on 802.11 enabled laptops and handheld devices to initiate and receive VoIP calls will explode.

It is well understood that quality of service ("QoS") is required for voice traffic in terms of delay, jitter and loss. At the same time, bandwidth on wireless links is far below that of wireline links (e.g., ethernet), and, therefore, uncontrolled access to the wireless medium can introduce unacceptable delay for VoIP traffic.

Therefore, to make efficient use of wireless resources and provide real-time services for VoIP packets, a need exists for a method and apparatus to manage the contention resulting from VoIP call signaling on the wireless medium. Without a solution to this problem, voice quality for VoIP calls over wireless LANs will degrade to unacceptable levels as the data/voice traffic on the wireless link increases. In other words, the method and apparatus should provide sufficient QoS to support wireless voice quality comparable to that of wireline links, even in the prospect of reduced wireless bandwidth.

SUMMARY OF THE INVENTION

In one aspect of the present invention, a method for providing quality-of-service to VoIP over a wireless local access network is provided. The method comprises sending an invite message from a calling party to a SIP proxy server and determining whether voice slots are available on an access point. The method forwards the invite message from the SIP proxy server to a called party, and if the called party sends an acknowledgement message to a calling party in response to receiving the invite message, the method adds the calling party to the polling list of the access point, and sends packets to and receives packets from the called party during a contention-free period of the access point.

In another aspect of the present invention, a machine-readable medium having instructions stored thereon for execution by a processor to perform a method for providing quality-of-service to VoIP over a wireless local access network is provided. The medium contains instructions for sending an invite message from a calling party to a SIP proxy server and determining whether voice slots are available on an access point. The medium contains instructions for forwarding the invite message from the SIP proxy server to a called party, and if the called party sends an acknowledgement message to a calling party in response to receiving the invite message, the medium contains instructions for adding the calling party to the polling list of the access point, and sending packets to and receiving packets from the called party during a contention-free period of the access point.

In yet another aspect of the present invention, a system for providing quality-of-service to VoIP over a wireless local access network is provided. The system contains means for sending an invite message from a calling party to a SIP proxy server and means for determining whether voice slots are available on an access point. The system contains means for forwarding the invite message from the SIP proxy server to a called party, and if the called party sends an acknowledgement message to a calling party in response to receiving the invite message, the system contains means for adding the calling party to the polling list of the access point, and means for sending packets to and receiving packets from the called party during a contention-free period of the access point.

BRIEF DESCRIPTION OF THE DRAWINGS

The invention may be understood by reference to the following description taken in conjunction with the accompanying drawings, in which like reference numerals identify like elements, and in which.

DETAILED DESCRIPTION OF PREFERRED EMBODIMENTS

Figure 1:
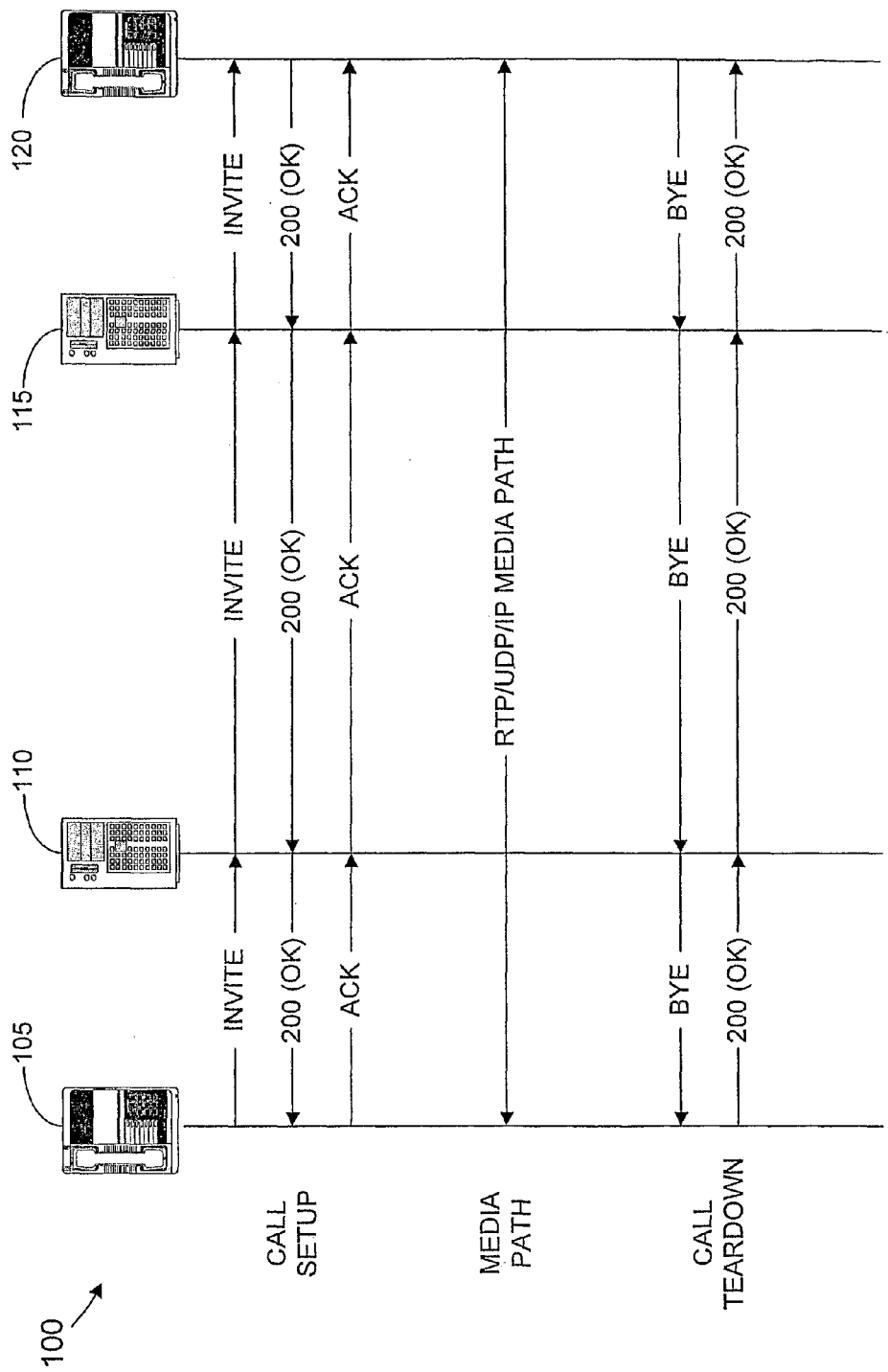
FIG. 1 is an exemplary SIP configuration, in accordance with one embodiment of the present invention.

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a outline undertaking for those of ordinary skill in the art having the benefit of this disclosure.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

It is to be understood that the systems and methods described herein may be implemented in various forms of hardware, software, firmware, special purpose processors, or a combination thereof. In particular, the present invention is preferably implemented as an application comprising program instructions that are tangibly embodied on one or more program storage devices (e.g., hard disk, magnetic floppy disk, RAM, ROM, CD ROM, etc.) and executable by any device or machine comprising suitable architecture, such as a general purpose digital computer having a processor, memory, and input/output interfaces. It is to be further understood that, because some of the constituent system components and process steps depicted in the accompanying Figures are preferably implemented in software, the connections between system modules (or the logic flow of method steps) may differ depending upon the manner in which the present invention is programmed. Given the teachers herein, one of ordinary skill in the related art will be able to contemplate these and similar implementations of the present invention.

As explained in greater detail in the disclosure herein, the present invention generally provides quality of service ("QoS") to Voice-over-IP ("VoIP") over an 802.11 wireless local area network ("LAN") by providing periodic, contention-free access to a wireless link for voice packets. This is achieved by coupling Session Initiation Protocol ("SIP") signaling for call setup with the Point Coordination Function ("PCF") mode of operation of the 802.11 medium access control ("MAC"). The result is that VoIP call signaling via SIP is tied with availability of periodic time-slots on the wireless medium. The periodic time-slots are used to guarantee contention-free access to the wireless link for voice packets.

Accordingly, the present invention, in effect, merges two networking technologies: SIP-based VoIP and 802.11-based wireless LANs. A brief overview of both technologies will now be presented.

Referring now to FIG. 1, an exemplary SIP configuration 100 is illustrated, in accordance with one embodiment of the present invention. SIP is a signaling protocol for VoIP. SIP comprises call messages for call setup, such as "INVITE," and for call teardown, such as "BYE." The call messages are usually sent as UDP/IP packets.

An exemplary call setup is described as follows. A first call endpoint ("user agent") 105 such as an IP Phone or a laptop running an IP softphone, registers with a first SIP Proxy 110 using a SIP REGISTER message (e.g., an INVITE message). The first SIP Proxy is responsible for routing the INVITE message via a second SIP Proxy 115 to a second call endpoint 120. It is understood that although only two SIP Proxies 110, 115 are shown in FIG. 1, any number of SIP Proxies may be used, as is known to those skilled in the art, for routing the INVITE message to the second call endpoint 120. When the second call endpoint 120 receives the INVITE message, the second call endpoint 120 initiates a SIP "200 (OK)" message, which is routed via the SIP Proxies 110, 115 to the first call endpoint 105. When the first call endpoint 110 receives the "200 (OK)" message, the first call endpoint 105 initiates a SIP "ACK" message, which is routed via the SIP Proxies 110, 115 to the second call endpoint 120. When the "ACK" message reaches the first call endpoint 105, the call setup has succeeded. The three SIP messages (i.e., INVITE, 200 (OK), ACK) may carry a Session Description Protocol ("SDP") payload describing an IP address and associated port numbers of the first call endpoint 105 and the second call endpoint 120. The SDP can also carry one or more media characteristics, such as codec type.

Once the call setup succeeds, voice packets may be sent as RTP/UDP/IP packets directly between the first call endpoint 105 and the second call endpoint 120 via the RTP/UDP/IP media path. When it is desired to terminate the call setup (i.e., initiate a call teardown), either the first call endpoint 105 or the second call endpoint 120 sends a "BYE" message to the other endpoint via the SIP Proxies 110, 115. As shown in FIG. 1, the second call endpoint 120 initiates the call teardown by sending a "BYE" message to the first call endpoint 105 via the second SIP Proxy 115 and the first SIP Proxy 110. The call teardown succeeds when the second call endpoint 120 receives the 200 (OK) message. 802.11 wireless LANs ("walls"), when used in infrastructure mode, as is generally the case for enterprise networks, comprise one or more client machines ("stations") and a central Access Point ("AP") (not shown). A medium access protocol ("MAC") specifies which station is to gain access to a wireless link (not shown) to transmit a packet. Two modes of medium access specified for 802.11 include a Distributed Coordination Function ("DCF") and a Point Coordination Function ("PCF"). In DCF mode, the stations contend with each other to gain channel access. Alternatively, in PCF mode, a central Point Coordinator ("PC") polls one of the stations (known as a "polled station") contained in a polling list of the PC. The polled station gains exclusive access to the wireless link for packet transmission/reception. The PC functionality is typically implemented in the AP. That is, the AP runs as the PC during the PCF mode. When polling the station, the PC may send a data packet to the station. Additionally, the PC may provide access to the polled station to transmit another data packet to the PC without contention from unpolled stations. This period of time where the polled station may transmit the data packet is known as a contention-free period ("CFP"). The CFP for a polled station is generally followed and/or preceded by a contention period ("CP"), in which the polled station becomes an unpolled station. That is, in the CP, the station does not have access to transmit the data packet. A "contention repetition interval" comprises a contention-free period and a contention period.

The stations express their intent to the PC to be on the polling list by sending MAC management frames (i.e., control messages) to the PC. The MAC management frames comprise, among other requests, an Association Request and a Re-association Request, as is known to those skilled in the art. There are two subfields in the Association Request and the Re-association Request management frames (hereinafter "(re)association management frames") that allow a station to express its interest to the PC to be included in the polling list. The two subfields are CF-Pollable and CF-Poll Request, which are located in the Capatibility Information field of the (re)association management frames. The (re)association management frames are used to associate or reassociate a station with the AP. If the CF-Pollable subfield is set to 1 and the CF-Poll Request subfield is set to 0, this indicates that the station delivering the message is interested in sending and receiving packets to and from the AP during the CFP.

Figure 2:
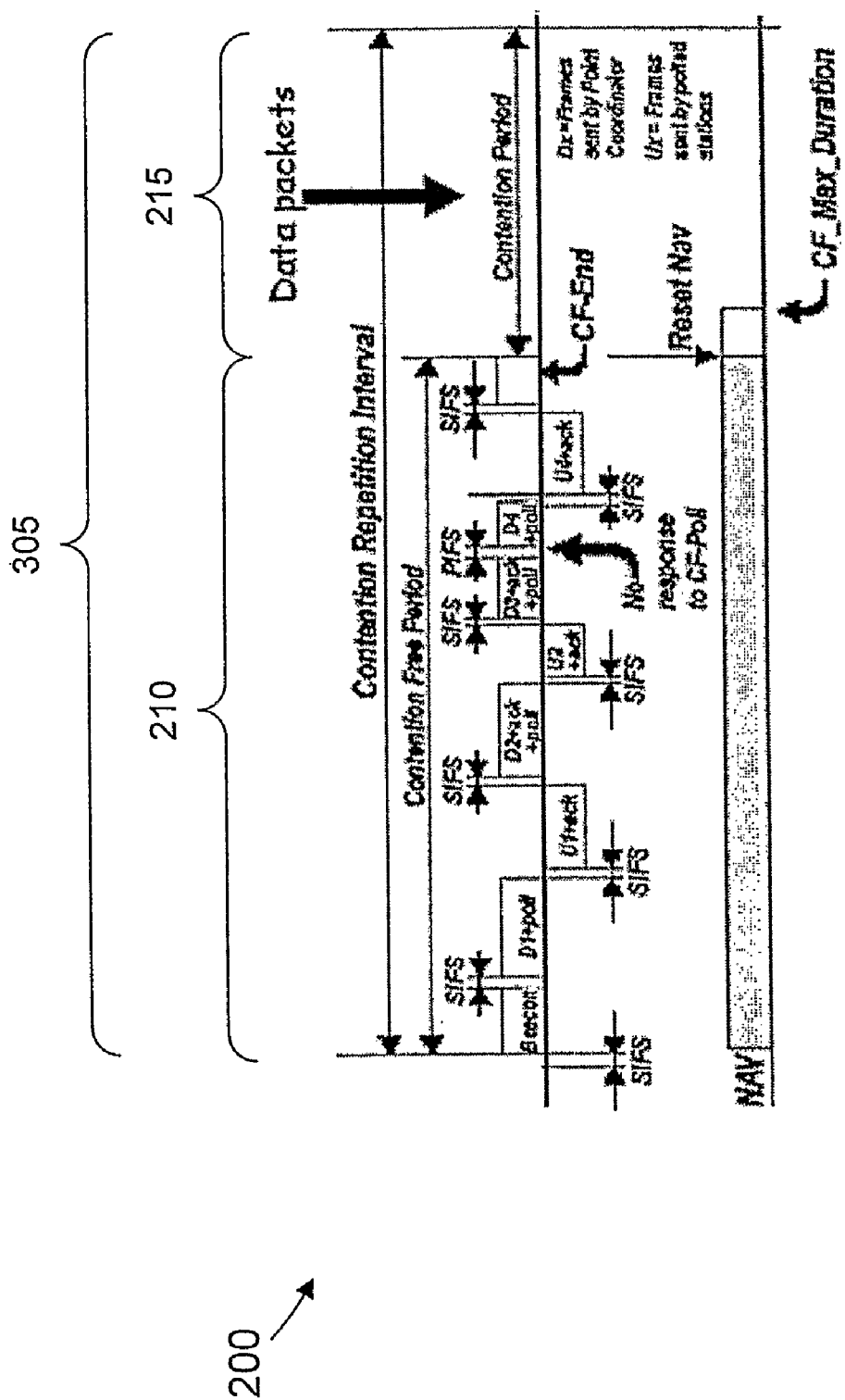
FIG. 2 is an exemplary operation of a superframe based on the IEEE 802.11 standard, in accordance with one embodiment of the present invention.

Referring now to FIG. 2, an exemplary operation of a superframe 200 based on the IEEE 802.11 standard is illustrated. The superframe 200 is a logical representation of data/voice packet transmissions between a client and an AP. The superframe 200 comprises one or more time intervals known as a contention repetition interval 205. The contention repetition interval 205 comprises a CFP 210 and a CP 215. During the CFP 210, PCF mode is ideally used. This is because the CFP 210 is generally intended for use by time-critical traffic such as voice packets. While in the CP 215, DCF mode is ideally used. This is because the CP 215 is generally intended for use by data traffic.

Current enterprise networks deploy wLANs using only the DCF mode, i.e., stations contend with each other to send packets to the AP. With DCF, there is no arbitration of wireless access by the AP, and the entire operation proceeds solely in CP. If SIP-based VoIP is deployed on DCF network, voice packets from one station may contend for channel access with other packets (voice and data) from other stations. Consequently, due to the nature of contention-based medium access, such as exponential back-off with retry attempts, voice packets may be delayed and not receive adequate QoS. Additionally, because there is no coupling of SIP call control and utilization/load on the wireless link, admitting a new voice call during high utilization of the wireless link leads to lost packets, which leads to poor voice quality.

Given the above overview of SIP-based VoIP, wireless LANs, and the problems associated with supporting VoIP over wLANs, the present invention will now be described. In one aspect of the present invention, SIP signaling is coupled with availability of resources on the wireless link using specific MAC mechanisms before a VoIP call is admitted. Core VoIP requires a signaling phase (usually via SIP) prior to media exchange between endpoints. The present invention can ensure that the VoIP call setup signaling succeeds only if a periodic time slot can be allocated on the wireless link using PCF. Instead of treating VoIP call setup and wireless medium access independently, availability of wireless resources is tied with VoIP call setup to ensure that if the call setup goes through, then adequate QoS is available on a wireless link for the VoIP call. The present invention integrates VoIP call control with a specific medium access method on a wLAN link that can offer periodic allocation of bandwidth for VoIP packets in a timely fashion.

Figure 3:
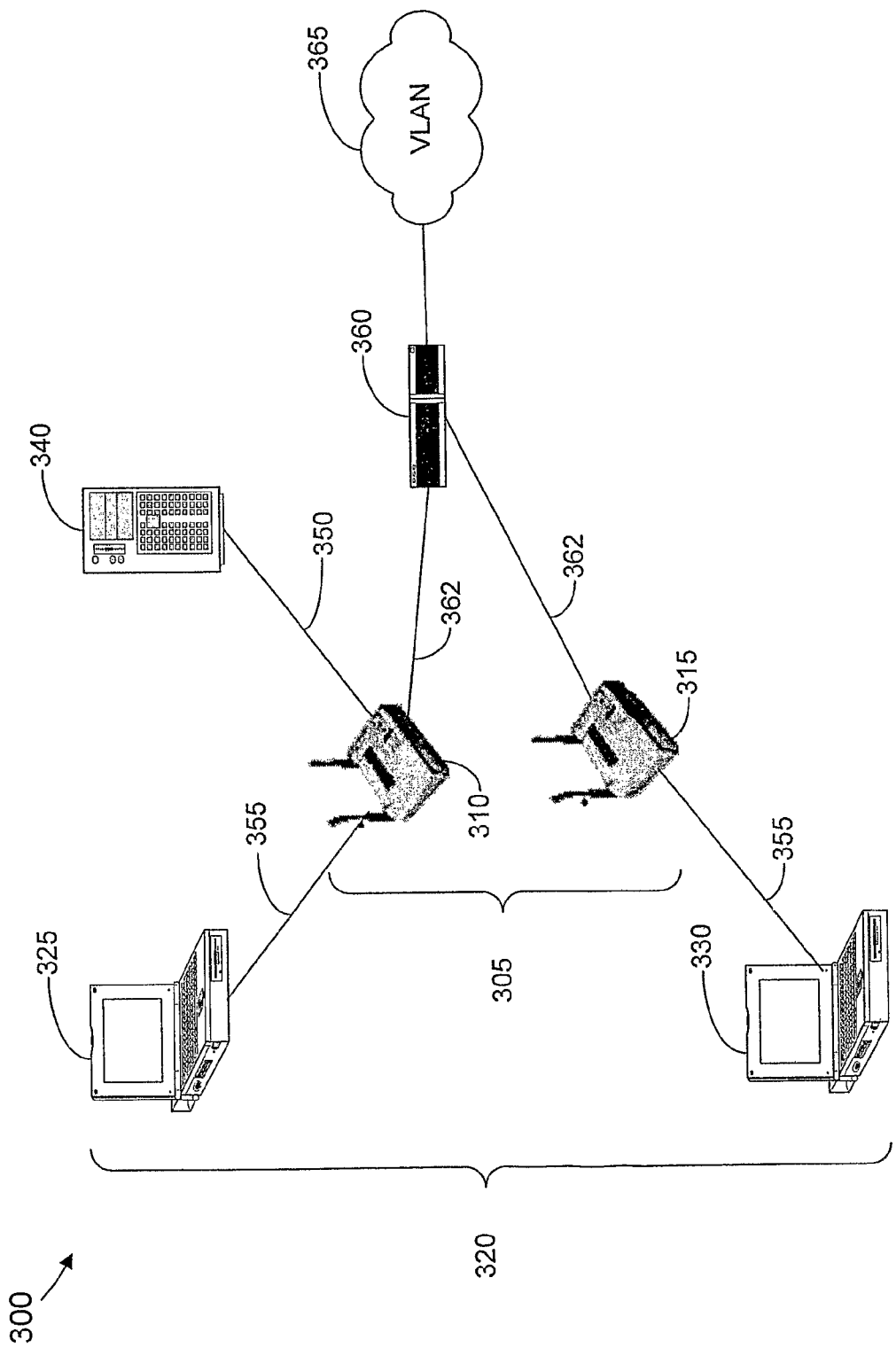
FIG. 3 is an exemplary SIP configuration, in accordance with one embodiment of the present invention.

Referring now to FIG. 3, a SIP configuration 300 is shown, in accordance with one embodiment of the present invention. SIP is a call-signaling protocol for VoIP. Two AP's 305 (a first AP 310 and a second AP 315) support a superframe comprising of CFP and CP periods, as described in greater detail in FIG. 2. As previously stated, PCF mode is generally used during CFP while DCF mode is generally used during CP. Two wLAN enabled SIP clients 320 (e.g., a laptop with a wLAN card and a IP softphone) are shown in FIG. 3: a calling party 325 (associated with the first AP 310) and a called party 330 (associated with the second AP 315). Although only two SIP clients 320 are shown in FIG. 3, it is understood that a typical SIP configuration may comprise any number of SIP clients 320. Further, although in FIG. 3 each SIP client 320 is associated with its own AP 305, one or more SIP clients 320 may be associated with a single AP 305.

The calling party 325 sends a SIP INVITE message to an SIP Proxy Server 340 using the CP on a wireless link 345. The SIP Proxy Server 340 has a control connection 350 to the AP 305 for querying the AP 305 of ongoing VoIP calls (i.e., the current calls in progress). The control connection 350 may use any of a variety of communication protocols (e.g., client-server, http, etc.). The control connection 350 is used for sending and/or receiving control protocol messages. Alternatively, the SIP Proxy Server 340 may internally keep track of ongoing (i.e., current) VoIP calls. Information of the current calls in progress in the AP 305 is used to determine the number of available voice slots in the AP 305. Whether voice slots are available given the number of current calls in progress" varies upon implementation of the call itself (e.g., the bit rate of a voice call) and the AP 305, as is known to those skilled in the art.

Based on current load on the AP 305 in terms of available voice slots on the superframe 200 of FIG. 2, the SIP Proxy Server 340 can either accept the SIP INVITE message for further processing or deny the call setup request. This ensures that if the call setup request is accepted, the calling party 325 will receive adequate time slots on the superframe to ensure that VoIP packets (i.e., voice packets) sent from the calling party 325 to the first AP 310 are not delayed. The VoIP packets are sent within a wireless coverage 355 of the AP 305.

Following a successful call setup, the calling party 325 adds itself to the polling list of the PC (typically implemented in the AP 305) using MAC management frames. It is understood that there may be another SIP Proxy Server (not shown) associated with the called party 330 and the second AP 315. The SIP Proxy Server 340 and the first AP 310 are shown in FIG. 3 as two separate machines. However, it is further understood that the SIP Proxy Server 340 and the first AP 310 may reside on the same machine. In the case of the SIP Proxy Server 340 and the first AP 310 residing on the same machine, it is understood that the communication protocol may not be necessary.

When either of the SIP clients 320 (i.e., the calling party 325 and the called party 330) terminates the call by sending a BYE SIP message to the SIP Proxy Server 340 on the wireless link 345, that SIP client 320 will also send a MAC management frame to the SIP Proxy Server 340 to remove itself from the list of stations polled by the PC (typically implemented in the AP 305) in the CFP. As a result, the PC does not waste time during the CFP to poll a station that is not in a voice call.

In addition to the calling party 325 adding itself to the polling list of the PC following a successful call setup, a similar action can be taken by the called party 330. The second AP 315 (which is connected to the called party 330) receives a SIP INVITE message sent from the calling party 325 via a router 360. The connections between the two APs 305 and the router 360 is typically a wireline link 362. The second AP 315 forwards the SIP INVITE message to the called party 330. The second AP 315 takes this action only if it can add the called party 330 to the polling list during the CFP. In other words, the AP 305 allows the call setup to go through only if the superframes are able to ensure that the voice packets 355 for this call can be transmitted periodically without contention. Thus, after the called party 330 receives the SIP INVITE and accepts the call by sending an ACK message via the wireless link 345 (as described in FIG. 1), the called party 330 sends a MAC management frame to a PC requesting to be added to the polling list of the PC.

It should be noted that the present invention applies when either or both SIP clients 310 are connected to a wireless network. When both SIP clients 310 are on wireless LANs, they each send MAC management frames to their respective APs so that their incoming and outgoing voice traffic is sent on the wireless link in PCF mode. When only one of the SIP clients 310 of a voice call is on a wireless link, then only that SIP client 310 can make use of this invention.

In addition to providing QoS on the wireless link, an extension to the scheme described herein is to couple the QoS on the wireless link with QoS on the wireline channel. In enterprise networks, QoS on wireline networks is typically achieved by using separate virtual LANs ("VLANs") 365 for data and voice. This is because enterprise networks typically use a switched network such as a switched ethernet. Alternatively, enterprise networks may use packet level QoS such as Differentiated Services. The Differentiated Services field of an IP header of the packet (previously known as Type-of-Service or "TOS" field) can be instantiated with different code points (Differentiated Service Code Point or "DSCP") to tag packets with different levels of QoS. With the present invention, packets on the wireless link that are received at the AP 205 from a wireless client during CFP can automatically be placed on the voice VLAN 365 on the wireline side (if the enterprise network is a switched ethernet) or tagged with an appropriate DCSP codepoint for voice level QoS (if the enterprise network uses Differentiated Services). Thus, the present scheme of prioritizing packets on the wireless link 345 can be coupled with the QoS mechanism being used in the wireline side to provide seamless QoS between the wireless and wireline portions of an enterprise network.

An additional aspect of our invention relates to mobility of a wireless station between the different APs (e.g., the first AP 310 and the second AP 315), while a VoIP call is in progress. For example, the calling party 325 could move from the range of the first AP 310 to the range of the second AP 315. There are two scenarios: 1) the APs belong to the same IP subnet and 2) the APs belong to different IP subnets.

In the first scenario, MAC management frames are used to forward packets to a wireless station (e.g., the calling partying 325, the called party 330). The IP address of the client remains unchanged. As mentioned earlier, if the wireless station changes its AP while a VoIP call is in progress, it re-associates with the "new" AP using a Re-association Request such that the client is directly added to the polling list at the new AP 105 (implementing the PC). In other words, the wireless station does not do a SIP level call setup before adding itself to the polling list at the new PC. This is because as far as the SIP session is concerned, the IP address of the wireless station is unchanged. That is, the wireless station re-associates with the new PC directly in PCF mode.

In the second scenario, the IP address of the wireless station changes. Therefore, the wireless station needs to send a SIP RE-INVITE message to the other wireless station. This message can be sent only after the client has associated itself with the new AP. SIP RE-INVITE is a SIP call setup message after an INVITE message has already been sent. It should be noted that the MAC level management frame that is sent is an Association Request rather than a Re-Association request since the new and the previous APs do not have any association, a new association needs to be created between the wireless station and the new AP. That is, the Association Request is sent to the new AP with the CF-Pollable and CF Poll-Request subfields of the Capability Information field set such that the wireless station is directly added to the polling list of the PC at the new AP. This allows voice packets of the ongoing call to be transmitted on the wireless link without contention.

Yet another aspect of present invention relates to how the AP determines which packets of a wireless station should be sent using the PCF mode. When a wireless station is added to the polling list of the PC, it is polled by the PC to check if it has any packet to transmit. It can potentially send either a data packet or a voice packet. Similarly when a particular wireless station's turn is reached in the polling list, the corresponding AP is free to transmit any packet to the wireless client. However, it may be wasteful if the CFP is used to transmit packets (either to or from a wireless station) that do not need QoS (e.g., data packets). Thus, the additional mechanism proposed herein is that when a wireless station is polled by the PC, only voice packets should be transmitted. This is easily achieved for packets on the "uplink" (i.e., from a wireless station to the AP) because the station, as part of the SIP call setup, is aware of the tuple <Source IP Address, Source Port#, Destination IP Address, Destination Port#>, and any packet with a matching 4-tuple belongs to the voice call and is sent during the PCF. Thus, it is easy to identify voice packets from data packets on the wireless station side. As used herein, the term "wireless station side" refers to the period that the wireless station transmits packets to the AP, and the term "AP side" refers to the period that the AP transmits packets to the wireless station.

On the AP side, identifying voice packets from data packets is generally not straightforward. However, with the present scheme of integrating the SIP proxy with the wireless AP, either on the same machine or on different machines with a control connection, as described herein, the AP is able to distinguish voice packets from data packets. This is possible because SIP INVITE and ACK messages contain the IP address and port numbers of both endpoints. Thus, when SIP INVITE and ACK messages flow through the SIP Proxy on the AP, it keeps track of the IP address and port# that will be used by each point. This enables the PC to distinguish voice packets from data packets on the "downlink" (i.e., from the AP to a wireless station). Any packet that matches the IP address and port pairs will be sent using the PCF mode. All other packets will be sent using the DCF mode. It should be further noted that the type of client device to which this invention can be applied may include any device with both a wireless LAN connection and a SIP-based IP Phone.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method for providing quality-of-service to VoIP over a wireless local access network comprising:
   receiving an invite message from a calling party by a SIP proxy server via an access point;
   determining whether voice slots are available on the access point;
   forwarding the invite message from the SIP proxy server to a called party, and
   if the called party sends an acknowledgement message to the calling party in response to receiving the invite message, adding the calling party to a polling list of the access point, and sending packets to and receiving packets from the called party during a contention-free period of the determined available voice slots of the access point.

2. The method of claim 1, further comprising if the voice slots are not available on the access point, sending a termination message from the SIP proxy server to the called party.

3. The method of claim 1, wherein the invite message comprises a SIP INVITE message.

4. The method of claim 3, wherein forwarding the invite message from the SIP proxy server to a called party comprises the SIP invite message from the SIP proxy server to a called party.

5. The method of claim 1, wherein the acknowledgement message comprises a SIP ACK message.

6. The method of claim 1, wherein sending a termination message from the SIP proxy server to the called party comprises sending a SIP BYE message from the SIP proxy server to the called party.

7. The method of claim 1, wherein adding the calling party to the polling list of the access point comprises sending a MAC management frame from the calling party to the access point requesting the calling party be added to the polling list.

8. The method of claim 7, wherein sending a MAC management frame from the calling party to the access point requesting the calling party to be added to the polling list comprises sending a MAC management frame from the calling party to a point coordinator of the access point.

9. The method of claim 1, further comprising adding the called party to the polling list of the access point.

10. The method of claim 9, wherein adding the called party to the polling list of the access point comprises sending a MAC management frame from the called party to the access point requesting the called party be added to the polling list.

11. The method of claim 10, wherein sending a MAC management frame from the called party to the access point requesting the called party be added to the polling list comprises sending a MAC management frame from the called party to a point coordinator of the access point.

12. The method of claim 1, further comprising adding the called party to a polling list of a new access point.

13. The method of claim 12, wherein adding the called party to the polling list of the new access point comprises sending a MAC management frame from the called party to the new access point requesting the called party be added to the polling list.

14. The method of claim 13, wherein sending a MAC management frame from the called party to the new access point requesting the called party be added to the polling list comprises sending a MAC management frame from the called party to a point coordinator of the new access point.

15. The method of claim 1, further comprising if the voice slots are available on the access point, at least one of sending a termination message from the called party to the calling party and sending a termination message from the calling party to the called party.

16. The method of claim 15, wherein at least one of sending a termination message from the called party to the calling party and sending a termination message from the calling party to the called party comprises at least one of sending a SIP BYE message from the called party to the calling party and sending a termination message from the calling party to the called party.

17. The method of claim 16, further comprising if at least one of the calling party and the called party sends a confirmation message, removing at least one of the calling party and the called party from the polling list of the access point.

18. The method of claim 17, wherein if at least one of the calling party and the called party sends a confirmation message comprises if at least one of the calling party and the called party sends a SIP OK message.

19. The method of claim 17, wherein removing at least one of the calling party and the called party from the polling list of the access point comprises sending a MAC management frame from the at least one of the calling party and the called party to the access point requesting the at least one of the calling party and the called party be removed from the polling list.

20. The method of claim 19, wherein sending a MAC management frame from the at least one of the calling party and the called party to the access point requesting the at least one of the calling party and the called party be removed from the point coordinator of the polling list.

21. The method of claim 1, further comprising if the called party sends an acknowledgement message to a calling party in response to receiving the invite message, moving at least one of the calling party and the called party to a new access point in a same IP subnet, and adding the at least one of the calling party and the called party to a polling list of the new access point.

22. The method of claim 1, further comprising if the called party sends an acknowledgement message to a calling party in response to receiving the invite message, moving at least one of the calling party and the called party to a new access point in a different IP subnet, adding the at least one of the calling party and the called party to a polling list of the new access point, and sending a re-invite message to at least one of the calling party and the called party.

23. The method of claim 22, wherein sending a re-invite message to at least one of the calling party and the called party comprises sending a SIP RE-INVITE message to at least one of the calling party and the called party.

24. The method of claim 1, wherein sending packets to and receiving packets from the calling party during a contention-free period of the access point comprises sending packets to the access point, wherein the access point forwards the packets to at least one of the called party and the calling party.

25. The method of claim 24, wherein sending packets to the access point further comprises sending packets from the access point to a voice VLAN via a wireline network, wherein the wireline network is a switched network.

26. The method of claim 25, wherein sending packets to the access point further comprises sending packets from the access point to a voice VLAN via a wireline network, wherein the wireline network is a switched ethernet.

27. The method of claim 26, wherein sending packets from the access point to a voice VLAN via a wireline network further comprises sending packets from the access point to a voice VLAN via a wireline network using packet level quality-of-service techniques.

28. The method of claim 27, wherein sending packets from the access point to a voice VLAN via a wireline network using packet level quality-of-service techniques comprises sending packets from the access point to a voice VLAN via a wireline network using Differentiated Services.

29. A machine-readable storage device having instructions stored thereon for execution by a processor to perform a method for providing quality-of-service to VoIP over a wireless local access network, the method comprising:

receiving an invite message from a calling party by a SIP proxy server via an access point;

determining whether voice slots are available on the access point;

forwarding the invite message from the SIP proxy server to a called party, and if the called party sends an acknowledgement message to the calling party in response to receiving the invite message, enabling the calling party to be added to a polling list of the access point for sending packets to and receiving packets from the called party during a contention-free period of the determined available slots of the access point.

30. The machine-readable storage device of claim 29, wherein the method further comprises if the voice slots are not available on the access point, sending a termination message from the SIP proxy server to the called party.

31. A system for providing quality-of-service to VoIP over a wireless local access network, comprising;
    means for receiving an invite message from a calling party by a SIP proxy server via an access point;
    means for determining whether voice slots are available on the access point;
    means for forwarding the invite message from the SIP proxy server to a called party, and
    if the called party sends an acknowledgement message to the calling party in response to receiving the invite message, means for adding the calling party to a polling list of the access point, and means for sending packets to and receiving packets from the called party during a contention-free period of the determined available voice slots of the access point.

32. The system of claim 31, further comprising means for sending a termination message from the SIP proxy server to the called party.

33. The system of claim 31, wherein one machine comprises the SIP proxy server and the access point.

34. The system of claim 31, wherein a first machine comprises the SIP proxy server and a second machine comprises the access point.

35. The system of claim 34, further comprising a communication protocol between the first machine and the second machine for allowing the SIP proxy server and the access point to communicate.

* * * * *